United States Patent

Harima et al.

Patent Number: 5,942,784
Date of Patent: Aug. 24, 1999

[54] SEMICONDUCTOR DEVICE

[75] Inventors: Takayuki Harima, Kawaguchi; Kenichi Nakamura, Sumida-ku; Mitsugi Ogura, Yokohama, all of Japan

[73] Assignee: Kabushiki Kaisha Toshiba, Tokyo, Japan

[21] Appl. No.: 08/891,558

[22] Filed: Jul. 11, 1997

[30] Foreign Application Priority Data

Jul. 16, 1996 [JP] Japan ................................. 8-185877

[51] Int. Cl.$^6$ ........................... H01L 29/76; H01L 29/94
[52] U.S. Cl. ............................................. 257/372; 257/371
[58] Field of Search ................................................ 257/372

[56] References Cited

U.S. PATENT DOCUMENTS 4,088,905  5/1978  Comer ........................................ 327/72
5,253,197  10/1993  Suzuki et al. ............................. 365/49

Primary Examiner—Wael M. Fahmy
Attorney, Agent, or Firm—Loeb & Loeb LLP

[57] ABSTRACT

A semiconductor device which achieves high-speed access and prevents the latch-up for any power inputting sequence by a plurality of power sources is disclosed. Where the chip voltage VDD is earlier inputted, an N well bias circuit 9 and a P well bias circuit 10 are activated, and an N-type well 12 and a P-type well 13 are biased respectively. After that, although the interface voltage VDDQ is inputted, the latch-up is not generated. On the other hand, where the interface voltage VDDQ is earlier inputted to a terminal 8, the N well bias circuit 9 and the P well bias circuit 10 are activated through a bypass circuit 15, and the N-type well 12 and the P-type well 13 are biased. Accordingly, although the chip voltage VDD is inputted after that, the latch-up is not generated.

7 Claims, 6 Drawing Sheets

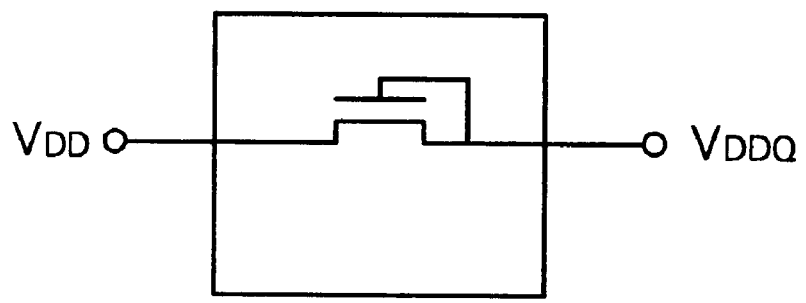
F I G. 3A
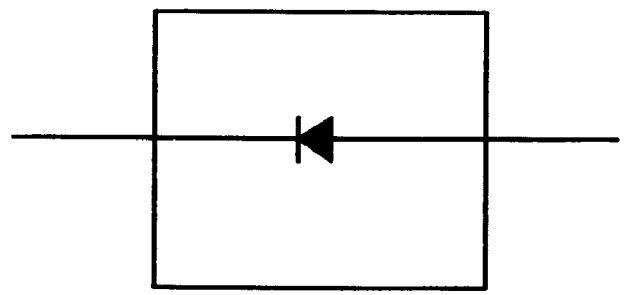
F I G. 3B
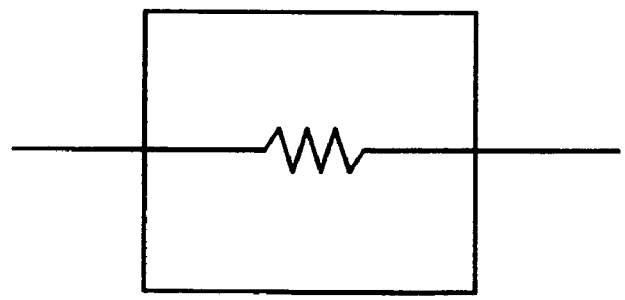
F I G. 3C

SEMICONDUCTOR DEVICE

BACKGROUND OF THE INVENTION

The present invention relates generally to a semiconductor device, and more particularly to a semiconductor device, which has a bias circuit and is supplied by a plurality of power sources, for prohibiting production of latch-up for any power inputting sequence.

Recently, since a CPU is developed to be operated by a low-voltage power source and so on, there is a case in which one semiconductor device has a plurality of power supply terminals and is supplied by different power sources. For example, such a semiconductor device has, besides a power source for the inside of a chip, a power source of a different voltage for an interface, an output buffer, etc., and is operated by these plurality of power sources.

FIG. 6 shows a sectional view of a CMOS static RAM operated by a plurality of voltages (cf. Unexamined Japanese Patent Application Pub. No. 06-243687). This RAM comprises a memory array and X and Y address registers. This structure is achieved by a Silicon On Insulation (SOI) semiconductor substrate in which P-type and N-type semiconductor substrates are combined and an insulator is located in the combined substrate. By adopting an SOI, high speed performance is easily achieved because of a low parasitic capacity of lines. In addition, latch-up is prevented because an NMOS transistor and a PMOS transistor are formed in a stripe state. "Latch-up" means a situation where a current continuously flows from a power source terminal to an earth terminal by existence of a parasitic transistor in a CMOS transistor structure.

In FIG. 6, a memory array MA and a X address register XD are formed. In the memory array MA, a PMOS transistor 69 is formed on a substrate region, i.e., an N-type well 67 separated by insulators 63 and 64. In addition, an NMOS transistor 68 is formed on a P⁻-type well 66 separated by insulators 62 and 63. Furthermore, an N⁺ region is formed on the N⁻-type well 67, and earth potential Vss is supplied to it as a substrate bias voltage. In addition, a P⁺ region is formed on the P⁻-type well 66, and a power source voltage VDD2 is supplied to it as a substrate bias voltage.

On the other hand, in the X address recorder XD, an NMOS transistor 71 is formed on a P⁻-type well 70 separated by insulators 61 and 62. Furthermore, a P⁺ region is formed on the P⁻-type well 70, and a power source voltage VDD1, which is different from a power source voltage VDD2, is supplied to it as a substrate bias voltage.

As described above, in a semiconductor device which has a plurality of parts operated by different power voltages, by supplying the power voltages and a earth potential as substrate bias voltages, it is possible to prevent a threshold voltage of MOS transistors from increasing to an unnecessarily high level and to achieve high-speed operation of a semiconductor device such as a RAM.

The occurrence of the latch-up can be prevented in an SOI, however, in a semiconductor device which does not have an insulator, the latch-up may be generated.

SUMMARY OF THE INVENTION

It is therefore an object of the present invention to achieve high-speed operation of an access and to protect and suppress the latch-up by providing a substrate bias voltage suitable for each N-type well and/or P-type well.

Furthermore, in a semiconductor device in which substrates or wells are biased for high-speed access, where a plurality of power sources for the inside of a chip, an interface and so on are supplied, the latch-up may be generated due to a power inputting sequence of the plurality of power supplies.

Another object of the invention is to suppress the occurrence of the latch-up for any power inputting sequence of a plurality of power sources by connecting a power source for the inside of a chip and that for an interface thorough a bypass circuit formed on the semiconductor device.

In accordance with the present invention, a semiconductor devise comprises:

an N-type substrate region having a first circuit formed thereon;

a P-type substrate region having a second circuit formed thereon adjacent to the N-type substrate region;

a first power source for providing a power voltage to a prescribed part of at least one of the first and second circuit and supplying a bias reference voltage for biasing the N-type or P-type substrate region;

a second power source for supplying a different voltage from the power voltage of the first power source to another prescribed part of the first or the second circuit, the other prescribed part being different from the prescribed part supplied by the first power source;

a substrate bias circuit for outputting a prescribed bias voltage by inputting the bias reference voltage supplied by the first power source and biasing the N-type or P-type substrate region; and a bypass circuit connected between the first and second power sources, the bypass circuit being turned on when supplied with a voltage only by the second power source and being turned off regardless of a state of voltage supply by the second power source when supplied with a voltage by the first power source.

BRIEF DESCRIPTION OF THE DRAWINGS

In the drawings:

FIG. 3A through 3C show examples of a circuit diagram of a bypass circuit;

DETAILED DESCRIPTION OF THE PREFERRED EMBODIMENTS

Figure 1:
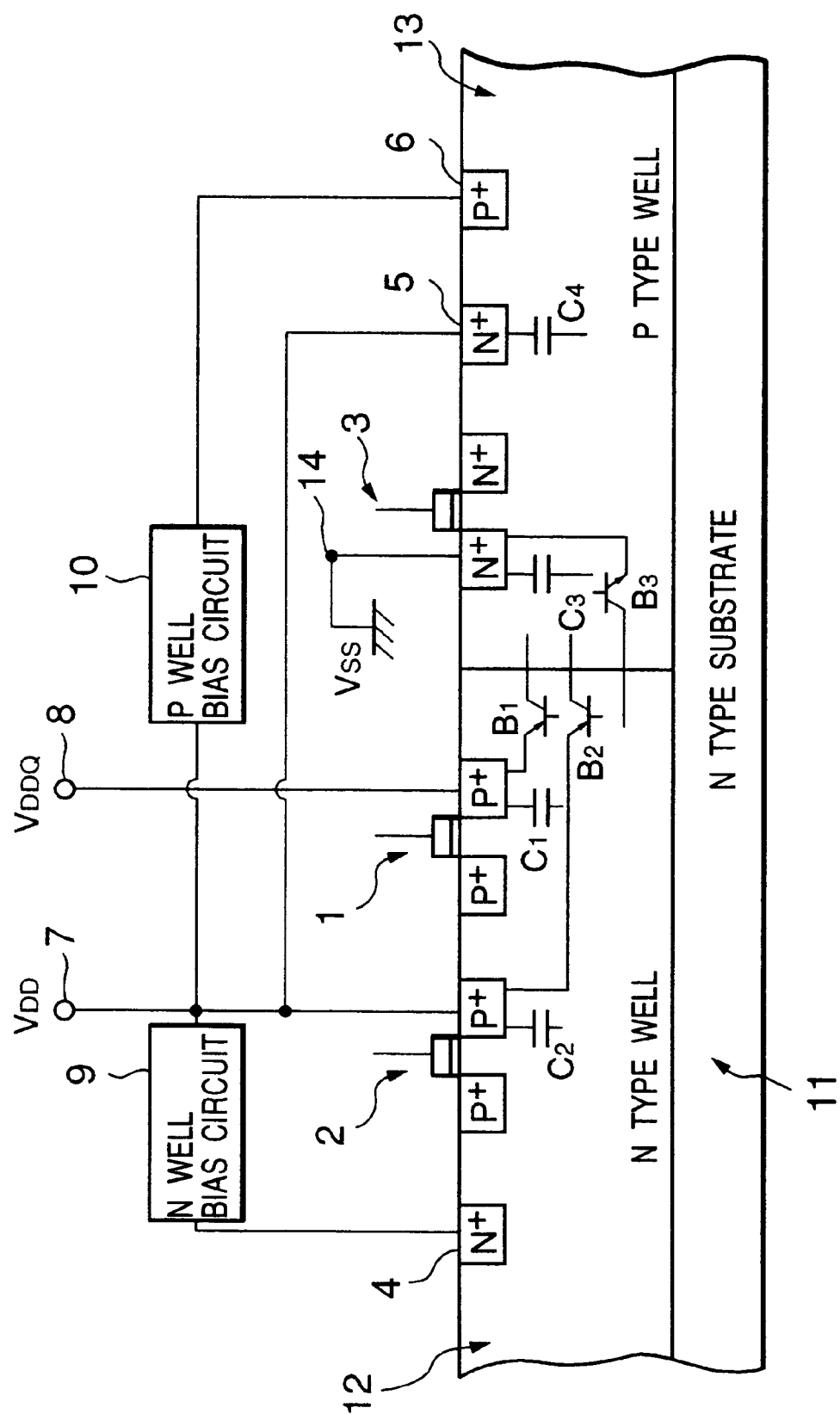
FIG. 1 show a construction diagram of a semiconductor device related to the invention, which has a plurality of bias circuits.

The above and further objects and novel features of the invention will more fully appear from the following detailed description when the same is read in connection with the accompanying drawings. It is to be expressly understood, however, that the drawing is for purpose of illustration only and is not intended as a definition of the limits of the invention.

FIG. 1 shows a construction diagram of a semiconductor device related to the invention, which has a plurality of bias circuits.

In the semiconductor device shown in FIG. 1, a plurality of voltages, e.g., a voltage VDD for the inside of a chip (hereinafter referred to as "the chip voltage VDD") and a voltage VDDQ for an interface (hereinafter referred to as "the interface voltage VDDQ"), are supplied as an operating power thereof. For example, a power source for the inside of a chip is used for a memory chip and so on, and a power source for an interface is used for an input-output interface, an input-output circuit and a decoder and so on. In this case, one of the chip voltage VDD or the interface voltage VDDQ is fixed at a relatively small voltage in absolute value such as 2.5V and lower consumption power performance can be achieved, and the other voltage is fixed at a relatively high absolute value such as 3.0V or 4.0V. Furthermore, each voltage may be fixed at a minus value of the same absolute value above-mentioned, and a proper voltage level may be supplied properly as the need arises.

In FIG. 1, an N-type well 12 and P-type well 13 are formed on a N-type substrate 11. Each gate electrode is formed through a gate oxide film on the N-type well 12 and the P-type well 13. A $P^+$-type source and a drain are formed on both sides of the gate electrode and the gate oxide film of the N-type well 12, and PMOS transistors 1 and 2 are formed. Furthermore, an $N^+$ region 4 is formed in the N-type well 12 for inputting a bias voltage. On the other hand, an $N^+$-type source and a drain are formed on both sides of the gate oxide film of the P-type well 13, and a NMOS transistor 3 is formed. Furthermore, an $N^+$ region 5 and a $P^+$ region 6 are formed in the P-type well 13 for inputting a bias voltage. In addition, the $N^+$ region 5 in the P-type well 13 is used for a pull-up and a pre-charge. This function is added as the need arises. In the semiconductor device aforementioned as described in FIG. 1, parasitic bipolar transistors B1 to B3 are generated, also parasitic capacities (junction capacitances) C1 to C4 are generated.

The chip voltage VDD, which is a power source voltage of the semiconductor device, is inputted to a first power source terminal 7 and is supplied to the PMOS transistor 2 and so on. Furthermore, the chip voltage VDD is supplied as a bias reference voltage of an N well bias circuit 9 and a P well bias circuit 10. An N well bias voltage is inputted to the $N^+$ region 4 by the N well bias circuit 9, and a P-type well bias voltage is inputted to the $P^+$ region 6 by the P well bias circuit 10. Here, the bias voltage by the N well bias circuit 9 is set, for example, at a level of the chip voltage VDD or over. On the other hand, the bias voltage by the P well bias circuit 10 is set, for example, at a level of the earth potential or less. These voltages may be set at a proper level as the need arises. As described above, since a small number of carriers accumulated in the parasitic capacities etc., can be eliminated by inputting a bias voltage to the P-type well and/or the N-type well, and high speed performance of a semiconductor device can be established.

In addition, concerning the power source, other than the chip voltage VDD, the interface voltage VDDQ for an input/output buffer, an output buffer and so on is inputted to a second power source terminal 8, and is supplied to, e.g., the PMOS transistor 1.

The circuits with reference to the N well bias circuit 9 and the P well bias circuit 10 are usually formed on the same substrate. The proper number of NMOS transistors and PMOS transistors are properly formed as the need arises. In addition, the chip voltage VDD and the interface voltage VDDQ can be supplied to prescribed devices as one thinks proper.

Referring to FIG. 1, a power inputting operation of the semiconductor device having bias circuits for both an N-type well and a P-type well will be explained below. Where a plurality of power sources are supplied, depending on the power inputting sequence, the semiconductor device is operated as (1) or (2) described below.

(1) First, such a case is assumed that the interface voltage VDDQ is inputted after the chip voltage VDD has already been inputted.

a) Power inputting operation by the chip voltage VDD

Where only the chip voltage VDD is inputted, the N well bias circuit 9 and the P well bias circuit 10 are activated. For example, the N-type well 12 is biased at a higher level than the chip voltage VDD, and the P-type well 13 is biased at a lower level than the earth voltage VSS.

b) Power inputting operation by the interface voltage VDDQ

Here, although the interface voltage VDDQ is inputted, the N-type well 12 is biased at a higher level than the chip voltage VDD. Accordingly, parasitic bipolar transistors B1 and B2 are kept off because each base voltage thereof is fixed.

Furthermore, a parasitic bipolar transistor B3 is also kept off because the P-type well 13 is biased at a lower level than the earth voltage VSS and the base voltage of the transistor is fixed thereby.

Subsequently, the latch-up, where a current continues flowing from the power source terminals 7 and 8 for the chip voltage VDD and the interface voltage VDDQ to earth VSS, is not generated.

(2) Next, such a case is assumed that the chip voltage VDD is inputted after the interface voltage VDDQ has already been inputted.

a) Power inputting operation by the interface voltage VDDQ

Where only the interface voltage VDDQ is inputted, the N well bias circuit 9 and the P well bias circuit 10 are not activated because the chip voltage VDD, which is to be a reference potential, is not inputted. Accordingly, where the voltage VF is defined as the voltage in floating state, the potential of the N-type well 12 is set at a level of (VDDQ−VF), and the potential of a P-type well 13 is set at a level of VF.

b) Power inputting operation by the chip voltage VDD

In this state, when the chip voltage VDD is inputted, the N well bias circuit 9 and the P well bias circuit 10 are activated. When the chip voltage VDD is inputted, the potential of the P-type well 13 increases over the floating voltage VF.

Subsequently, the parasitic bipolar transistor B3 turns on, and a current flows from the N-type well 12 biased at the level of (VDDQ−VF) to the earth VSS through an $N^+$ region of the NMOS transistor 3.

Accordingly, the potential of the N-type well 12 decreases and the base potential of the parasitic bipolar transistor B1 is also decreases. Therefore, the parasitic bipolar transistor B1 turns on.

Consequently, a current flows through a pass, i.e., the interface voltage VDDQ (the second power source terminal 8)—the $P^+$ a region of the PMOS transistor 1 in the N-type well 12—the parasitic bipolar transistors B1 and B3—the $N^+$ region of the NMOS transistor 3 in the P-type well 13—the earth VSS (i.e., latch-up).

The potential of the P-type well 13 further decreases thereby.

Accordingly, a pass, i.e., the chip voltage VDD (the first power source terminal 7)—the $P^+$ region of the PMOS transistor 2 in the N-type well 12—the parasitic bipolar transistors B2 and B3—the $N^+$ region of the NMOS transistor 3 on the P-type well 13—the earth VSS, is formed and a current flows through the pass (i.e., latch-up).

Consequently, the latch-up, where a current continues flowing from the power source terminals 7 and 8 for the chip voltage VDD and the interface voltage VDDQ to the earth VSS, is generated.

As described above, in the semiconductor device related to FIG. 1, the bias voltage can be properly determined and high speed performance of the operation can be established. Furthermore, latch-up is prevented by, at first, inputting the power source used as the reference voltage of the bias circuit, e.g. the chip voltage VDD, then inputting the other power source, e.g. the interface voltage VDDQ.

Figure 2:
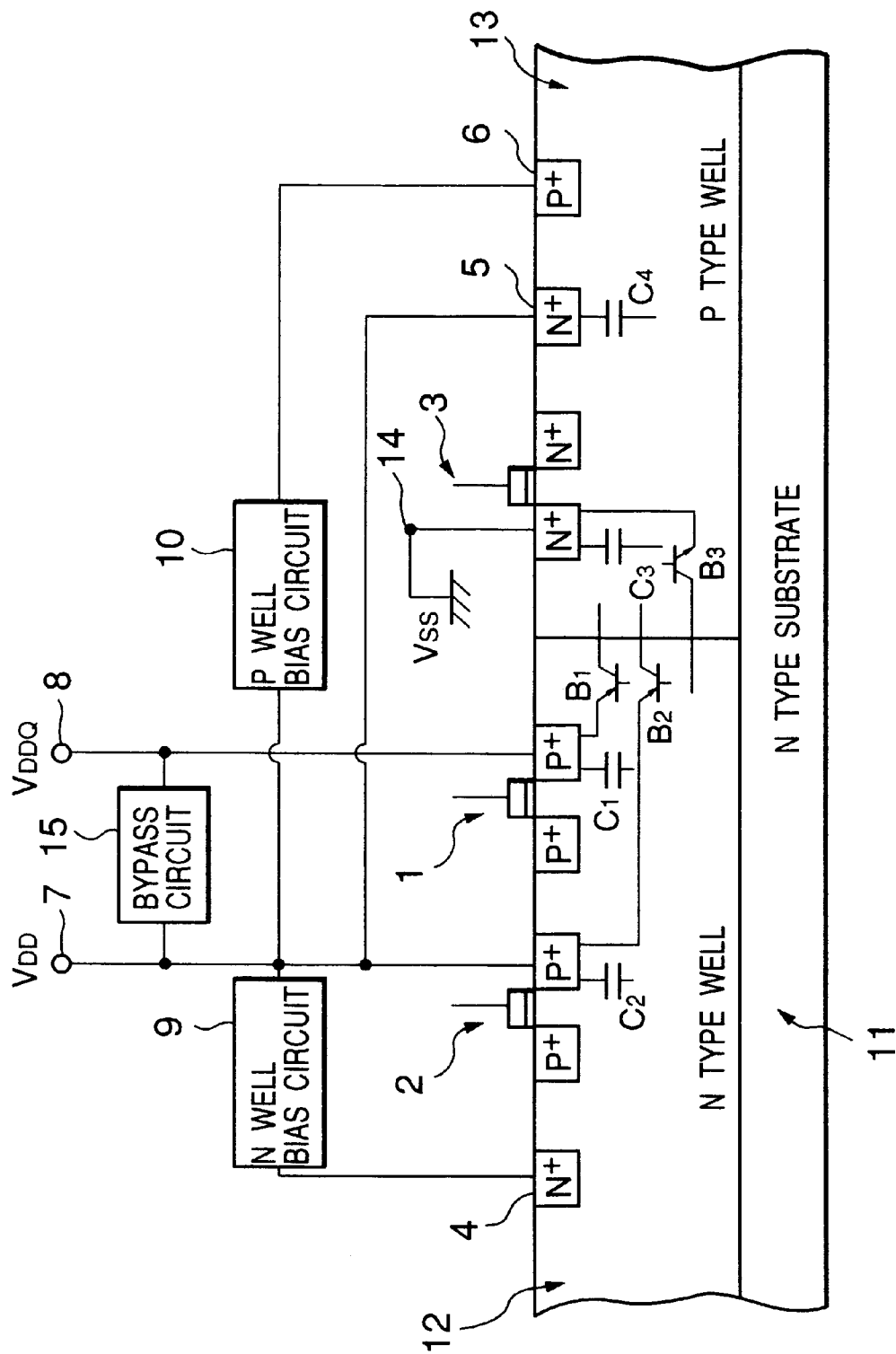
FIG. 2 shows a constructive diagram of a semiconductor device according to a first embodiment of the invention, which has a plurality of bias circuits and is operated by a plurality of power sources.

Next, FIG. 2 shows a constructive diagram of the semiconductor device according to the first embodiment of the invention, which has a plurality of bias circuits and is operated by a plurality of power sources.

As mentioned earlier, in the semiconductor device, a substrate or a well of which is biased for high speed operation of an access time etc., where the voltage for the inside of a chip is supplied as a reference power source of the bias circuit and, prior to its supply, the voltage for an interface is inputted, and latch-up occurs. This phenomenon is more easily generated when the floating voltage VF of a parasitic bipolar transistor is low especially at high temperature.

In the first embodiment of the invention, the bypass circuit 15 is connected between the voltage for the inside of a chip and the voltage for an interface in addition to the structure shown in FIG. 1. This bypass circuit 15 has one direction characteristic which turns on/off depending on the voltage values of the both sides thereof. For example, the bypass circuit 15 turns on where only the interface voltage VDDQ is inputted and, on the other hand, these power sources can not have an influence on each other where the both power sources are inputted.

Now, it is assumed that, for example, the chip voltage VDD is higher than the interface voltage VDDQ. In this case, each of FIG. 3A through 3C shows an example of a circuit diagram of a bypass circuit. In FIG. 3A a transistor is connected to achieve the bypass function above-mentioned. Other than using a transistor, the bypass circuit 15 can be designed by a circuit accomplishing the similar function, for example, by a circuit using a diode shown in FIG. 3B or that using a resistor shown in FIG. 3C. Where a resistor of high resistance is connected instead of a transistor, it is necessary to properly set the value of the resistance for suitably operating the bias circuits since consumption of electricity and voltage drop are generated in the bypass circuit.

On the other hand, where the chip voltage VDD is lower then the interface voltage VDDQ, the same function can be achieved if the threshold of the element is set at the prescribed high level.

In addition, the N well bias circuit 9 and the P well bias circuit 10 can be constructed to output the bias voltage within the prescribed range even where either the chip voltage VDD or the interface voltage VDDQ is supplied as a reference voltage.

Referring to FIG. 2, the power inputting operation of the semiconductor device having bias circuits for both the N-type well and the P-type well. Where a plurality of power sources are provided, depending on the power inputting sequence, the semiconductor device is operated as (1) or (2) described below.

(1) First, such a case is assumed that the interface voltage VDDQ is inputted after the chip voltage VDD has already been inputted.

a) Power inputting operation by the chip voltage VDD

Where only the chip voltage VDD is inputted, the N well bias circuit 9 and the P well bias circuit 10 are activated. For example, the N-type well 12 is biased at a higher level than the chip voltage VDD, and the P-type well 13 is biased at a lower level than the earth voltage VSS.

In this case, the bypass circuit 15 turns off because of the condition of voltages of the both sides, and it bypasses nothing.

b) Power inputting operation by the interface voltage VDDQ

Here, although the interface voltage VDDQ is inputted, the bypass circuit 15 is kept off because the voltage condition of both sides is not changed, and the both power sources do not affect each other.

The N-type well 12 is biased at a higher level than the chip voltage VDD. Accordingly, the parasitic bipolar transistors B1 and B2 are kept off because each base voltage thereof is fixed.

Furthermore, the parasitic bipolar transistor B3 is also kept off because the P-type well 13 is biased at a lower level than the earth voltage VSS and the base voltage of the transistor is fixed thereby.

Subsequently, the latch-up, where a current continues flowing from the power source terminals 7 and 8 for the chip voltage VDD and the interface voltage VDDQ to the earth VSS, is not generated.

(2) Next, such a case is assumed that the chip voltage VDD is inputted after the voltage of VDDQ for an interface has already been inputted.

a) Power inputting operation by the interface voltage VDDQ

Where only the interface voltage VDDQ is inputted, the bypass circuit 15 turns on by the condition of voltages of the both sides.

Accordingly, the interface voltage VDDQ is supplied via the bypass circuit 15 to the N well bias circuit 9 and the P well bias circuit 10. Since the N well bias circuit 9 and the P well bias circuit 10 are already activated, the N-type well 12 is set at a higher level than the chip voltage VDD, and the P-type well 13 is set at a lower level than the earth voltage VSS.

b) Power inputting operation by the chip voltage VDD

Here, when the chip voltage VDD is inputted, the bypass circuit 15 turns off because the voltage condition of the both sides changes.

Since the N well bias circuit 9 is already activated, the N-type well 12 is set at a higher voltage than the chip voltage VDD. Subsequently, the parasitic bipolar transistor B1 and B2 are kept off because each base voltage is fixed.

Furthermore, since the P well bias circuit 10 is already activated and the P-type well 13 is set at a lower voltage than the earth voltage VSS, the parasitic bipolar transistor B3 is kept off because its base voltage is fixed.

Consequently, the latch-up, where a current continues flowing from the power source terminals 7 and 8 for the chip voltage VDD and the voltage VDDQ for a interface to the earth VSS, is not generated.

Figure 4:
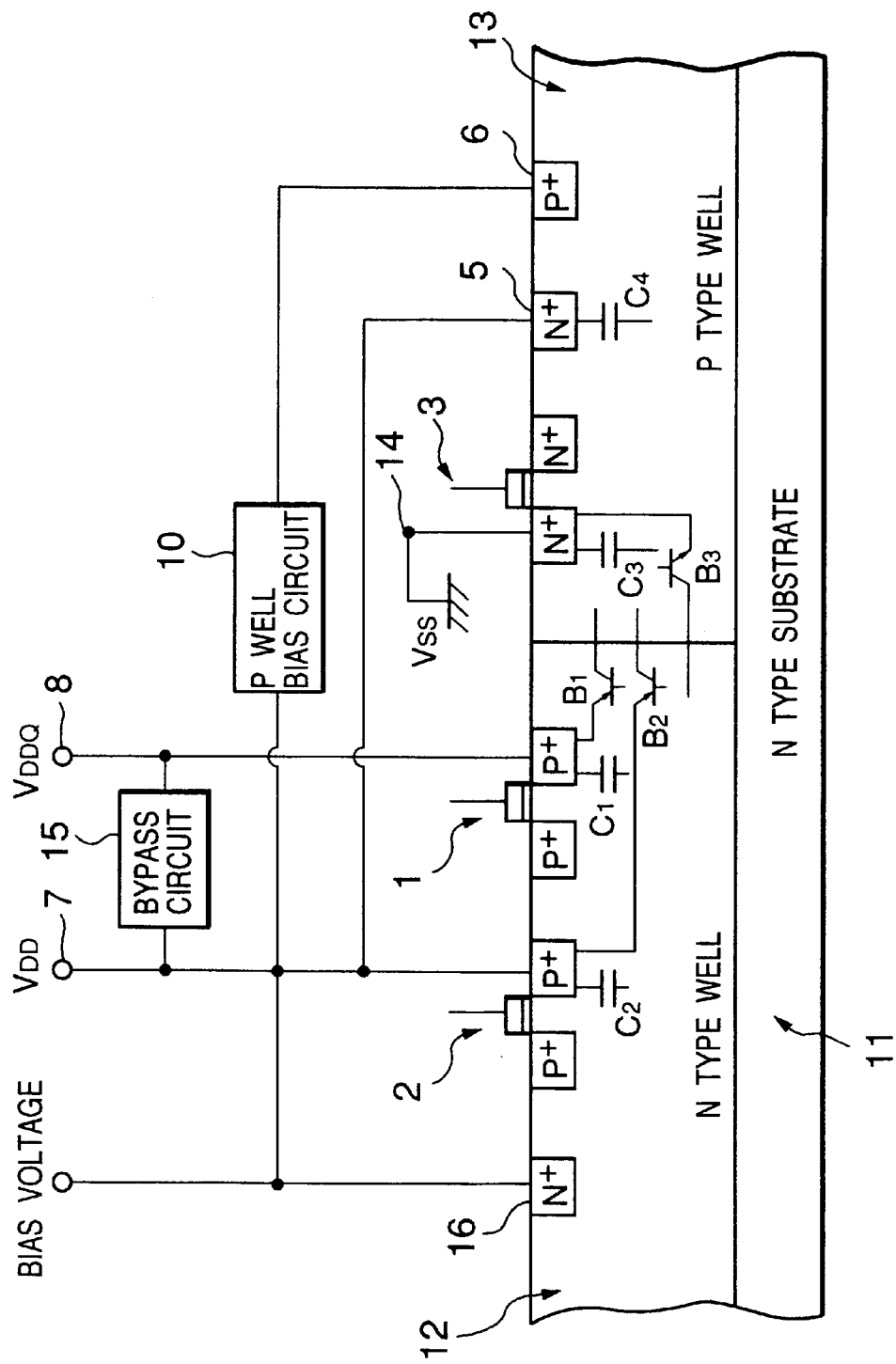
FIG. 4 shows a constructive diagram of a semiconductor device according to a second embodiment of the invention, which has only a P well bias circuit 10 and is operated by a plurality of power sources.

Next, FIG. 4 shows a constructive diagram of a semiconductor device according to the second embodiment of the invention, which has only a P well bias circuit 10 and is operated by a plurality of power sources.

In the second embodiment, the N well bias circuit 9 of the first embodiment shown in FIG. 2 is eliminated. Furthermore, by forming a $N^+$ region 16 in the N-type well 12, a bias voltage at a fixed level may be inputted.

Referring to FIG. 4, the power inputting operation of the semiconductor device having bias circuits for only the P-type well is explained below. Where a plurality of power sources are provided, depending on a power inputting sequence, the semiconductor device is operated as (1) or (2) described below.

(1) First, such a case is assumed that the interface voltage VDDQ is inputted after the chip voltage VDD has been inputted.

a) Power inputting operation by the chip voltage VDD

Where only the chip voltage VDD is inputted, the P well bias circuit 10 is activated. For example, a P-type well 13 is biased at a lower level than the earth voltage VSS.

In this case, the bypass circuit 15 turns off because of the condition of voltages of the both sides, and it bypasses nothing.

b) Power inputting operation by the interface voltage VDDQ

Here, although the interface voltage VDDQ is inputted, the bypass circuit 15 is kept off because the voltages of both sides are not changed, and the both power sources do not affect each other.

A parasitic bipolar transistor B3 is kept off because the P-type well 13 is biased at a lower level than the earth voltage VSS and the base voltage of the transistor is fixed.

Furthermore, when a bias voltage is inputted to a N$^+$ region 16, the N-type well 12 is biased at higher a level than the chip voltage VDD. Accordingly, the parasitic bipolar transistors B1 and B2 are kept off because each base voltage thereof is fixed.

Subsequently, the latch-up, where a current continues flowing from the power source terminals 7 and 8 for the chip voltage VDD and the interface voltage VDDQ to the earth VSS, is not generated.

(2) Next, such a case is assumed that the chip voltage VDD is inputted after the interface voltage VDDQ has been inputted.

a) Power inputting operation by the interface voltage VDDQ

Where only the interface voltage VDDQ is inputted, the bypass circuit 15 turns on by the voltage condition of the both sides thereof.

Accordingly, the interface voltage VDDQ is supplied via the bypass circuit 15 to the P well bias circuit 10. Since the P well bias circuit 10 is activated, the P-type well 13 is biased at a lower level than the earth voltage VSS.

b) Power inputting operation by the chip voltage VDD

Here, when the chip voltage VDD is inputted, the bypass circuit 15 turns off because the voltage condition of the both sides changes.

Since the P well bias circuit 10 is already activated and the P-type well 13 is set at a lower level than the earth voltage VSS, the parasitic bipolar transistor B3 keep off because its base voltage is fixed.

Furthermore, where a bias voltage is inputted to a N$^+$ region 16, the N-type well 12 is set at a higher voltage than the chip voltage VDD. Accordingly, the parasitic bipolar transistor B1 and B2 are kept off because each base voltage is fixed.

Consequently, the latch-up, where a current continues flowing from the power source terminals 7 and 8 for the chip voltage VDD and the interface voltage VDDQ to the earth VSS, is not generated.

Figure 5:
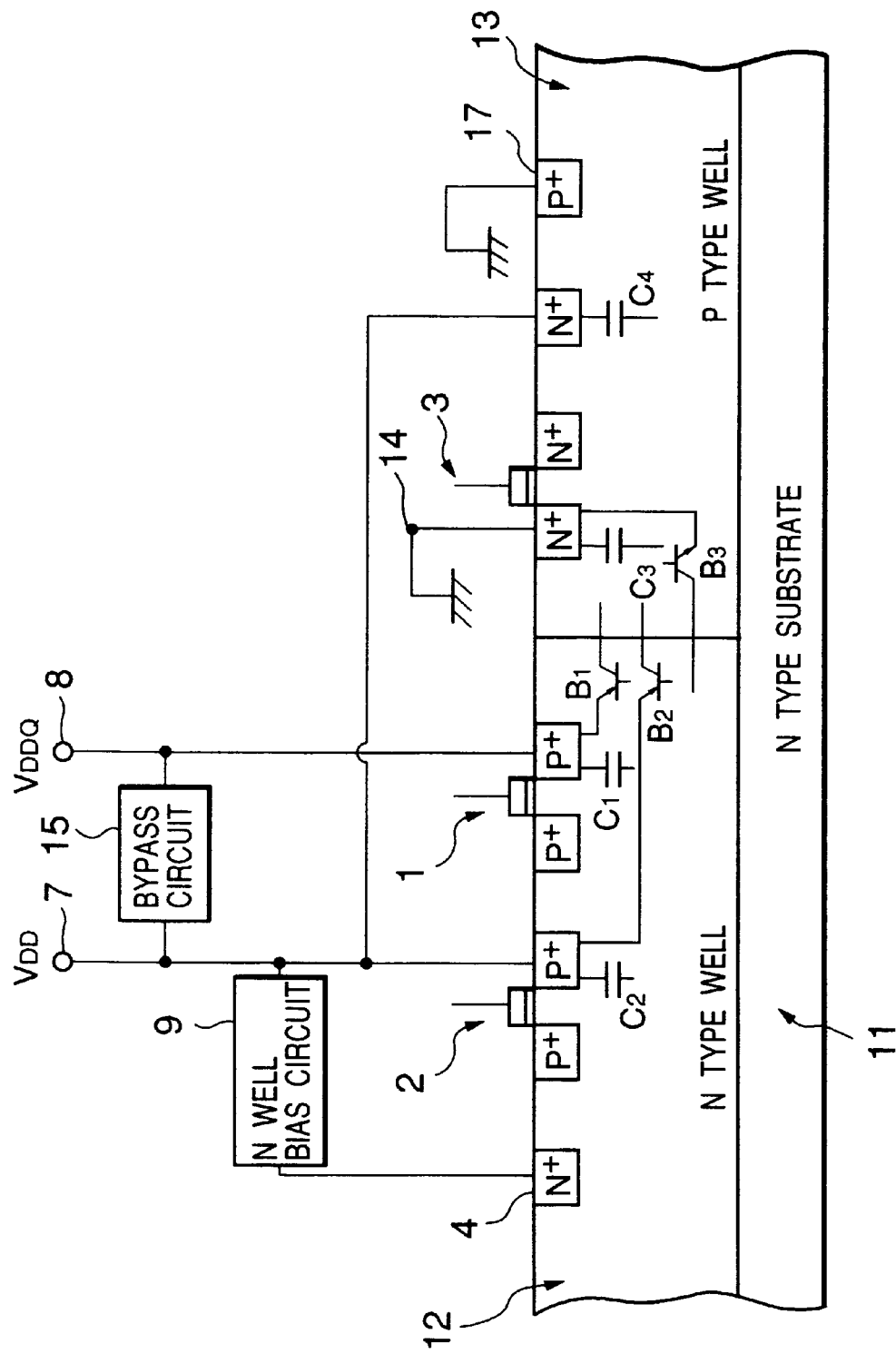
FIG. 5 shows a constructive diagram of a semiconductor device according to a third embodiment of the invention, which has only an N well bias circuit 9 and is operated by a plurality of power sources.
Figure 6:
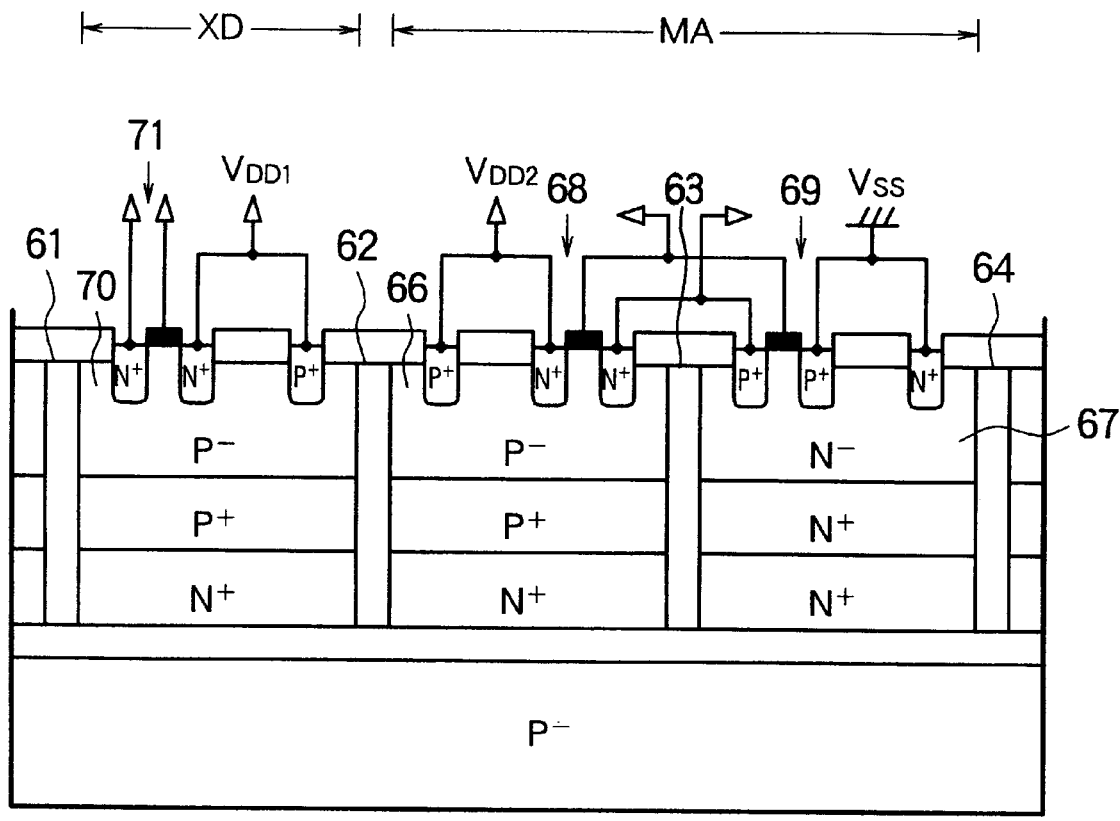
FIG. 6 shows a section of a CMOS static RAM operated by a plurality of power sources.

FIG. 5 shows a constructive diagram of a semiconductor device according to the third embodiment of the invention, which has only an N well bias circuit 9 and is operated by a plurality of power sources.

In the third embodiment, the P well bias circuit 10 of the first embodiment shown in FIG. 2 is eliminated. Furthermore, a P$^+$ region 17 may be formed in the P-type well 13 and be biased at a fixed level of an earth potential.

Referring to FIG. 5, the power inputting operation of a semiconductor device having a bias circuit only for a P-type well will be explained below. Where a plurality of power sources are provided, depending on a power inputting sequence, the semiconductor device is operated as (1) or (2) described below.

(1) First, such a case is assumed that the interface voltage VDDQ is inputted after the chip voltage VDD is already inputted.

a) Power inputting operation by the chip voltage VDD

Where only the chip voltage VDD is inputted, the N well bias circuit 9 is activated. For example, a N-type well 12 is biased at a higher level than the chip voltage VDD.

In this case, the bypass circuit 15 turns off because of the condition of voltages of the both sides, and it bypasses nothing.

b) Power inputting operation by the interface voltage VDDQ

Here, although the interface voltage VDDQ is inputted, the bypass circuit 15 is kept off because the voltage condition of both sides is not changed.

The N-type well 12 is fixed at a higher level than the chip voltage VDD. Accordingly, The parasitic bipolar transistors B1 and B2 are kept off because each base voltage is fixed.

Furthermore, as the P-type well 13 is biased at the earth potential by the P$^+$ region 17, the parasitic bipolar transistors B3 is also kept off because the base voltage thereof is fixed.

Subsequently, the latch-up, where a current continues flowing from the power source terminals 7 and 8 for the chip voltage VDD and the interface voltage VDDQ to the earth VSS, is not generated.

(2) Next, such a case is assumed that the chip voltage VDD is inputted after the voltage of VDDQ for an interface has already been inputted.

a) Power inputting operation by the interface voltage VDDQ

Where only the interface voltage VDDQ is inputted, the bypass circuit 15 turns on by the condition of voltages of the both sides.

Accordingly, the interface voltage VDDQ is supplied via the bypass circuit 15 to the N well bias circuit 9. Since the N well bias circuit 9 is activated, the N-type well 12 is set at a higher level than the chip voltage VDD.

b) Power inputting operation by the chip voltage VDD

Here, where the chip voltage VDD is inputted, the bypass circuit 15 turns off because the voltage condition of both sides changes.

The N well bias circuit 9 has been already activated and the N-type well 12 is set at a higher level than the chip voltage VDD. Accordingly, the parasitic bipolar transistors B1 and B2 are kept off because each base voltage is fixed.

Furthermore, since the P-type well 13 is set at the earth potential by the P a region 17, the parasitic bipolar transistor B3 is also kept off because its base voltage is fixed.

Consequently, the latch-up, where a current continues flowing from the power source terminals 7 and 8 for the chip voltage VDD and the voltage VDDQ to the earth VSS, is not generated.

This invention may also be applied to the SOI structure and the Silicon on Sapphire (SOS) structure.

What is claimed is:

1. A semiconductor device comprising:

an N-type substrate region having a first circuit formed thereon;

a P-type substrate region having a second circuit formed thereon adjacent to said N-type substrate region;

a first power source for providing a power voltage to a prescribed part of at least one of said first and second circuit and supplying a bias reference voltage for biasing said N-type or P-type substrate region;

a second power source for supplying a different voltage from said power voltage of said first power source to another prescribed part of said first or said second circuit, said other prescribed part being different from the prescribed part supplied by said first power source;

a substrate bias circuit for outputting a prescribed bias voltage by inputting said bias reference voltage supplied by said first power source and biasing said N-type or P-type substrate region; and a bypass circuit connected between said first and second power sources, said bypass circuit being turned on when supplied with a voltage only by said second power source and being turned off regardless of a state of voltage supply by said second power source when supplied with a voltage by said first power source.

2. A semiconductor device according to claim 1, wherein said bypass circuit is turned off when supplied with a voltage in advance by said first power source, then being kept off even if supplied with a voltage by said second power source thereafter, and said bypass circuit is turned on when supplied in advance by said second power source, then being turned off when supplied with a voltage by said first power source thereafter.

3. A semiconductor device according to claim 1, wherein said substrate bias circuit includes:

an N well bias circuit biasing said N-type substrate region at a voltage of said first power source or over; or a P well bias circuit biasing said P-type substrate region at an earth potential or less.

4. A semiconductor device according to claim 1, wherein said bypass circuit and said substrate bias circuit are formed on a semiconductor substrate on which said first or second circuit is formed.

5. A semiconductor device according to claim 1, wherein said bypass circuit consists of MOS transistors using a diode connection.

6. A semiconductor device according to claim 1, wherein one of said first and second power sources is a power source for an inside of a chip and the other is a power source for an interface.

7. A semiconductor device according to claim 1, wherein a voltage of said first power source is higher than that of said second power source.

* * * * *